United States Patent
Gross et al.

(10) Patent No.: US 11,099,219 B2
(45) Date of Patent: Aug. 24, 2021

(54) ESTIMATING THE REMAINING USEFUL LIFE OF A POWER TRANSFORMER BASED ON REAL-TIME SENSOR DATA AND PERIODIC DISSOLVED GAS ANALYSES

(71) Applicant: Oracle International Corporation, Redwood Shores, CA (US)

(72) Inventors: Kenny C. Gross, Escondido, CA (US); Edward R. Wetherbee, Omaha, NE (US)

(73) Assignee: Oracle International Corporation, Redwood Shores, CA (US)

( * ) Notice: Subject to any disclaimer, the term of this patent is extended or adjusted under 35 U.S.C. 154(b) by 417 days.

(21) Appl. No.: 16/295,613

(22) Filed: Mar. 7, 2019

(65) Prior Publication Data

US 2019/0293697 A1    Sep. 26, 2019

Related U.S. Application Data

(60) Provisional application No. 62/648,121, filed on Mar. 26, 2018.

(51) Int. Cl.
*G01R 19/25*    (2006.01)
*G06N 20/00*    (2019.01)
*G06N 5/04*    (2006.01)

(52) U.S. Cl.
CPC ........... *G01R 19/2513* (2013.01); *G06N 5/04* (2013.01); *G06N 20/00* (2019.01)

(58) Field of Classification Search
CPC ................ G01R 19/25; G01R 19/2513; G01R 31/62; G01R 31/003; G06N 20/00; G06N 5/04

See application file for complete search history.

(56) References Cited

U.S. PATENT DOCUMENTS 4,733,361 A * 3/1988 Krieser ............... G07C 3/00
340/945
7,702,485 B2 * 4/2010 Gross .................. G06F 11/008
702/183

(Continued)

FOREIGN PATENT DOCUMENTS

AU    707304 B2 * 7/1999 ......... G05B 19/4184
BR    PI 0608117 A2 * 9/2010 ............... H02H 5/10

(Continued)

OTHER PUBLICATIONS

Peter Richard Wall, Online Prediction of the Post-Disturbance Frequency Behaviour of a Power System, 2018, 24 pages (Year: 2018).*

Primary Examiner — Tung S Lau
(74) Attorney, Agent, or Firm — Park, Vaughan, Fleming & Dowler LLP (57) ABSTRACT

During a surveillance mode, the system receives present time-series signals gathered from sensors in the power transformer. Next, the system uses an inferential model to generate estimated values for the present time-series signals, and performs a pairwise differencing operation between actual values and the estimated values for the present time-series signals to produce residuals. The system then performs a sequential probability ratio test on the residuals to produce alarms having associated tripping frequencies (TFs). Next, the system uses a logistic-regression model to compute a risk index for the power transformer based on the TFs. If the risk index exceeds a threshold, the system generates a notification that the power transformer needs to be replaced. The system also periodically updates the logistic-regression model based on the results of periodic dissolved gas analyses for the transformer to more accurately compute the index for the power transformer.

20 Claims, 4 Drawing Sheets

(56) References Cited

U.S. PATENT DOCUMENTS

| | | | | |
|---|---|---|---|---|
| 8,200,372 B2 * | 6/2012 | Joos | ............ | H02J 3/38 |
| | | | | 700/292 |
| 8,719,614 B2 * | 5/2014 | Yensen | ............ | G04G 3/04 |
| | | | | 713/500 |
| 9,813,173 B2 * | 11/2017 | Achanta | ............ | H04J 3/0638 |
| 10,122,487 B2 * | 11/2018 | Whitehead | ............ | G06F 1/14 |
| 2003/0187621 A1 * | 10/2003 | Nikitin | ............ | G06F 17/18 |
| | | | | 702/189 |
| 2008/0140362 A1 * | 6/2008 | Gross | ............ | G06F 11/008 |
| | | | | 703/2 |
| 2009/0319093 A1 * | 12/2009 | Joos | ............ | H02J 3/38 |
| | | | | 700/297 |
| 2014/0379039 A1 * | 12/2014 | Hareland | ............ | A61B 5/349 |
| | | | | 607/2 |
| 2020/0272140 A1 * | 8/2020 | Gross | ............ | G06K 9/00536 |
| 2021/0065316 A1 * | 3/2021 | Wetherbee | ............ | G06Q 50/06 |
| 2021/0158202 A1 * | 5/2021 | Baclawski | ............ | G06F 16/2474 |

FOREIGN PATENT DOCUMENTS

| | | | | | |
|---|---|---|---|---|---|
| CN | 111143973 B | * | 1/2011 | ............ | G06F 30/20 |
| CN | 104484723 A | * | 4/2015 | ............ | G06Q 10/04 |
| CN | 109359271 A | * | 2/2019 | ............ | G06F 17/18 |
| CN | 109919394 A | * | 6/2019 | ............ | Y02E 40/70 |
| CN | 111143973 A | * | 5/2020 | ............ | G06F 30/20 |
| CN | 111382897 A | * | 7/2020 | ............ | G06Q 10/04 |
| DE | 3443276 C2 | * | 4/1996 | ............ | H02K 11/00 |
| GB | 2150774 A | * | 7/1985 | ............ | G01R 31/343 |
| IN | 201821012217 | * | 10/2019 | ............ | H02H 3/44 |
| WO | WO 2021/045835 A1 | * | 2/2011 | ............ | G06F 17/40 |

* cited by examiner

ESTIMATING THE REMAINING USEFUL LIFE OF A POWER TRANSFORMER BASED ON REAL-TIME SENSOR DATA AND PERIODIC DISSOLVED GAS ANALYSES

RELATED APPLICATION

This application claims priority under 35 U.S.C. § 119 to U.S. Provisional Application No. 62/648,121, entitled "Power Transformer Real Time Prognostics and Bootstrapped Remaining Useful Life Estimation" by the same inventors as the instant application, filed on 26 Mar. 2018, the contents of which are incorporated herein by reference.

BACKGROUND

Field

The disclosed embodiments generally relate to techniques for computing the remaining useful life of a power transformer. More specifically, the disclosed embodiments relate to a technique for estimating the remaining useful life of a power transformer based on real-time sensor data and periodic dissolved gas analysis measurements.

Related Art

Power transformers are critical assets for the uninterrupted delivery of electrical power from power generation facilities to consumers in electrical distribution grids. Electrical grids are typically "fault tolerant" with respect to losing generation assets, because whenever a power plant fails, replacement power can usually be pulled through the distribution grid to meet consumer demand. In contrast, power transformer failures typically lead to "blackouts," which may affect consumers in small areas comprising a few blocks, or may possibly affect consumers through an entire service region comprising hundreds of square miles. Also, the failure of a single transformer can potentially cause a very large voltage spike to be propagated through the distribution grid, which can cause other transformers to fail, and can lead to a large-scale, regional blackout. Transformer explosions can also cause fires, which can result in significant property damage and loss of life. Hence, it is desirable to be able to monitor the operational health of power transformers, if possible, to identify degraded transformers before they fail.

The present state of the art for power transformer monitoring is dissolved gas analysis (DGA). DGA operates by detecting the presence of dissolved hydrocarbon gasses in oils, which are used to bathe the transformer windings. When components inside a transformer become hot enough to generate hydrocarbon gasses, this indicates a heat-related problem in the transformer. The problem with DGA is that it requires oil samples to be periodically extracted from transformers and chemical analyses to detect the presence of the hydrocarbon gasses. This process is both time-consuming and expensive, which means that DGAs are performed infrequently, for example once a year. Moreover, a DGA is essentially "reactive" and not "prognostic" because it detects the downstream symptoms of problems, well after the problems caused hotspots that were sufficient to "bake out" the hydrocarbon gasses.

Hence, what is needed is a technique for assessing the operational health of a power transformer without the above-described shortcomings of existing DGA techniques.

SUMMARY

The disclosed embodiments provide a system that estimates a remaining useful life (RUL) of a power transformer. During a surveillance mode, the system iteratively performs the following operations. First, the system receives a set of present time-series signals gathered from sensors in the power transformer. Next, the system uses an inferential model to generate estimated values for the set of present time-series signals, and performs a pairwise differencing operation between actual values and the estimated values for the set of present time-series signals to produce residuals. The system then performs a sequential probability ratio test (SPRT) on the residuals to produce SPRT alarms having associated tripping frequencies (TFs). Next, the system uses a logistic-regression model to compute an RUL-based risk index for the power transformer based on the TFs. Finally, if the RUL-based risk index exceeds a risk-index threshold, the system generates a notification indicating that the power transformer needs to be replaced. The system additionally periodically updates the logistic-regression model based on the results of periodic dissolved gas analyses (DGAs) for the transformer to more accurately compute the RUL-based index for the power transformer.

In some embodiments, during an inferential-training mode, which precedes the surveillance mode, the system receives an inferential training set of time-series signals gathered from sensors in the power transformer during normal fault-free operation. The system then trains the inferential model to predict values of the time-series signals based on the inferential training set.

In some embodiments, during an RUL-training mode, which follows the inferential training mode and precedes the surveillance mode, the system receives an RUL training set of time-series signals gathered from sensors in similar power transformers while the similar power transformers were run to failure. The system also receives results of periodic DGAs for the similar power transformers while the similar power transformers were run to failure, and also failure times for the similar power transformers. Next, the system uses the inferential model to generate estimated values for the RUL training set of time-series signals, and performs a pairwise differencing operation between actual values and the estimated values for the RUL training set of time-series signals to produce residuals. The system then performs a SPRT on the residuals to produce SPRT alarms having associated TFs. Finally, the system trains the logistic-regression model to predict an RUL for the power transformer based on correlations among the SPRT alarm TFs, the results from the periodic DGAs for the similar power transformers, and the failure times for the similar power transformers that experienced failure after long term operation.

In some embodiments, while updating the logistic-regression model based on the results of a periodic DGA, the system uses the results of the periodic DGA as an additional input to the logistic-regression model, so that the logistic-regression model more accurately computes the RUL-based index for the power transformer.

In some embodiments, the time-series signals gathered from sensors in the power transformer include signals specifying one or more of the following: temperatures; currents; voltages; resistances; capacitances; vibrations; cooling system parameters; and control signals.

In some embodiments, the TFs are windowed TFs, which are associated with preceding time windows of SPRT alarms.

In some embodiments, the inferential model comprises a Multivariate State Estimation Technique (MSET) model.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The disclosed embodiments operate by continuously monitoring the internal health of a power transformer based on time-series data from sensors inside the transformers to facilitate the discovery of incipient anomalies that arise during the multi-month "blind spots" between consecutive manual DGAs. Hence, our technique does not replace dissolved gas analysis, but instead combines the supplemental results from DGAs with time-series sensor data to more accurately estimate the RUL of a power transformer.

Note that sensors have been incorporated into transformers for over 30 years. Utility systems can monitor signals from these sensors on their own, or they can use commercially available to tools to do so. Existing systems that monitor these signals typically use a crude technique called "thresholding" to detect problems. For example, if readings from a temperature sensor start to exceed a high-temperature threshold, or if readings from an internal voltage start to sag below a low-voltage threshold, an alert is generated.

However, this type of threshold-based technique suffers from an inherent seesaw effect between sensitivity and false alarms. For example, while monitoring noisy process metrics, if one wants to detect incipient problems earlier, one lowers the thresholds closer to the nominal mean values of the signals being monitored. However, doing so increases the false alarm rate from spurious data values in the distribution. Note that false alarms can be extremely costly because they can cause properly functioning assets to be taken out of service, thereby causing a potential loss of revenue. To avoid these false alarms, the thresholds can be moved farther away from their nominal mean values. However, this means that severe degradation can be underway (or the system can possibly fail) before any alerts are generated.

The technique used in the disclosed embodiments breaks this seesaw effect between sensitivity and false alarms by providing early notice of the onset of mechanisms that can lead to failure. While doing so, this technique also monitors the evolving degradation of those mechanisms, and can compute an RUL for the transformers.

Note that accurate RUL estimates are highly advantageous for effective predictive maintenance of power transformers. For example, it makes a significant difference to a utility if an RUL estimate for a power transformer is five weeks (i.e., five weeks before the failure probability reaches 95%), because the utility can proactively schedule preventative maintenance during the lowest-load time during the next five weeks. However, if the RUL estimate for the power transformer is 10 hours instead of five weeks, the utility can immediately start routing replacement energy through the grid to isolate that transformer, and can then safely take the power transformer offline for immediate maintenance—as opposed to having no prognostics and no accurate RUL estimates, and encountering a catastrophic failure that can cascade through the grid and take out other transformers.

Existing power transformers contain dozens of internal sensors to monitor various parameters, such as distributed temperatures, currents, copper winding vibrations, interconnect resistances, voltages, bushing capacitance deviations, internal cooling signals and other control signals. Moreover, existing transformers provide an internal "system bus" that brings the digitized sensor signals to a single data-acquisition application-programming interface (API), which can be accessed from outside the transformer through a physical adaptor or a wireless link. Our new technique does not replace or modify any of the internal sensors or firmware inside a power transformer, but instead consumes the digitized time-series signals from internal sensors "downstream" from the API and subsequently performs computations to perform prognostic and RUL analyses.

During these computations, our system first analyzes time-series signals from an archive for a time period during which the transformer was completely "fault free" to produce "fault-free training data." To perform this analysis, our system uses the Multivariate State Estimation Technique (MSET). Note that MSET has a number of advantages over other machine-learning-based techniques, such as neural networks, support-vector machines (SVMs), and kernel regression, in terms of lower false-alarm and missed-alarm probabilities, and lower overhead compute cost. Our system uses MSET to generate estimated values for the time-series signals, and performs a pairwise differencing operation between actual values and the estimated values for the set of time-series signals to produce residuals. The system performs a SPRT on the residuals to produce SPRT alarms having associated TFs.

The system then uses a logistic-regression model to compute an RUL-based risk index for the power transformer based on the TFs and results from periodic DGAs. Note that using the results from periodic DGAs as inputs to the logistic-regression model improves the accuracy of the resulting RUL-based risk index as compared with only using TFs computed from the telemetry signals by themselves.

Before we describe the operation of this new RUL-estimation technique for power transformers further, we first describe an exemplary prognostic-surveillance system in which the new technique operates.

Prognostic-Surveillance System

Figure 1:
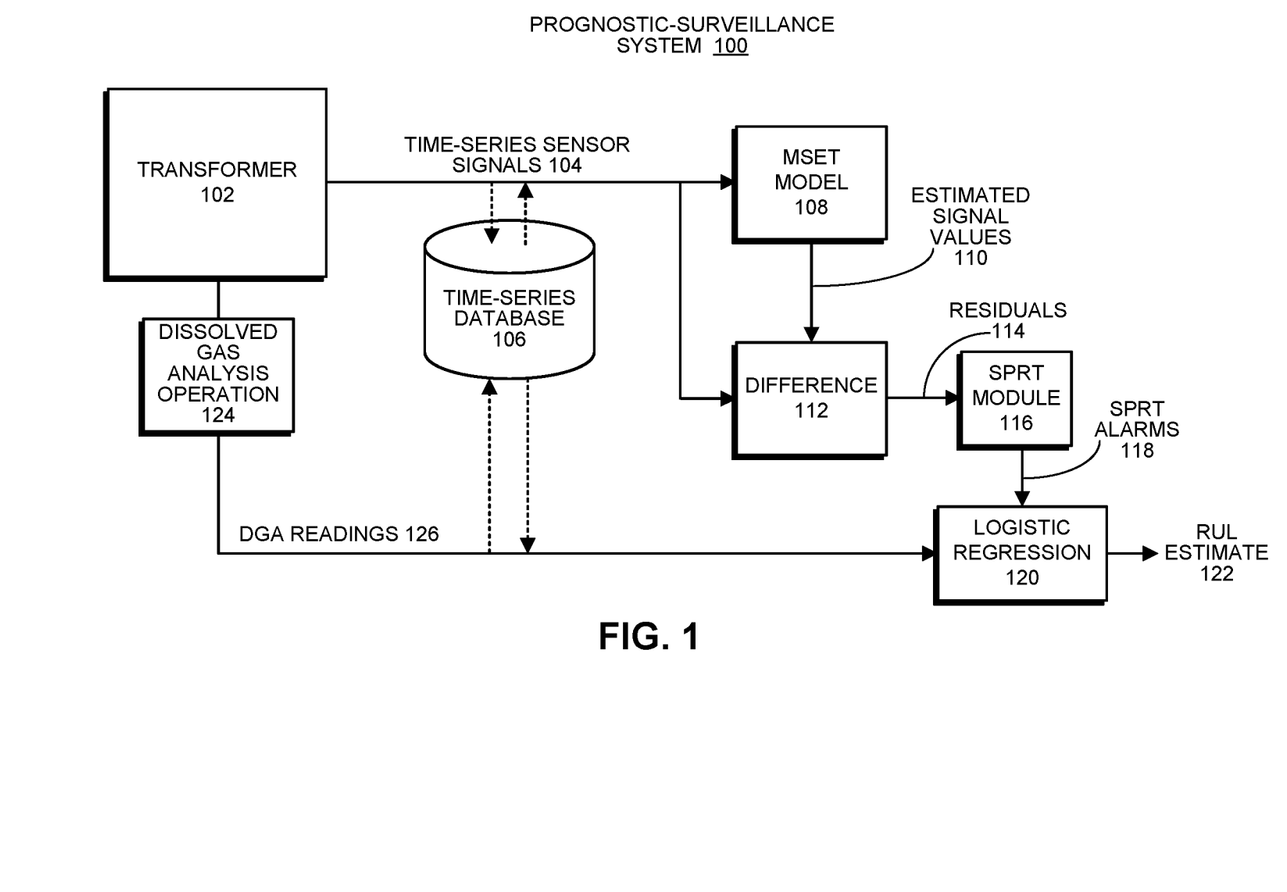
FIG. 1 illustrates an exemplary prognostic-surveillance system for a transformer in accordance with the disclosed embodiments.

FIG. 1 illustrates an exemplary prognostic-surveillance system 100 that accesses a time-series database 106, containing time-series signals in accordance with the disclosed embodiments. As illustrated in FIG. 1, prognostic-surveillance system 100 operates on a set of time-series sensor signals 104 obtained from sensors in a power transformer 102. Note that time-series signals 104 can originate from any type of sensor, which can be located in a component in power transformer 102, including: a voltage sensor; a current sensor; a pressure sensor; a rotational speed sensor; and a vibration sensor.

During operation of prognostic-surveillance system 100, time-series signals 104 can feed into a time-series database 106, which stores the time-series signals 104 for subsequent analysis. Next, the time-series signals 104 either feed directly from power transformer 102 or from time-series database 106 into an MSET pattern-recognition model 108. Although it is advantageous to use MSET for pattern-recognition purposes, the disclosed embodiments can generally use any one of a generic class of pattern-recognition techniques called nonlinear, nonparametric (NLNP) regression, which includes neural networks, support vector machines (SVMs), auto-associative kernel regression (AAKR), and even simple linear regression (LR).

Next, MSET model 108 is "trained" to learn patterns of correlation among the time-series signals 104. This training process involves a one-time, computationally intensive computation, which is performed offline with accumulated data that contains no anomalies. The pattern-recognition system is then placed into a "real-time surveillance mode," wherein the trained MSET model 108 predicts what each signal should be, based on other correlated variables; these are the "estimated signal values" 110 illustrated in FIG. 1. Next, the system uses a difference module 112 to perform a pairwise differencing operation between the actual signal values and the estimated signal values to produce residuals 114. The system then performs a "detection operation" on the residuals 114 using SPRT module 116 to detect anomalies and possibly to generate SPRT alarms 118. (For a description of the detailed operation of SPRT module 116, please see Wald, Abraham, June 1945, "Sequential Tests of Statistical Hypotheses," *Annals of Mathematical Statistics*, 16 (2): 117-186.)

As illustrated in FIG. 1, a DGA operation 124 is periodically performed to detect the presence of dissolved hydrocarbon gasses in oils, which are used to bathe transformer 102's windings. This DGA operation 124 produces DGA readings 126, which feed into logistic-regression model 120 and possibly into time-series database 106. The SPRT alarms 118 and DGA readings 126, which feed into logistic-regression model 120, are then used to generate an RUL estimate 122, wherein the RUL estimate 122 can be expressed as a "quantitative risk index" as is described in more detail below.

RUL-Estimation Technique

Figure 2:
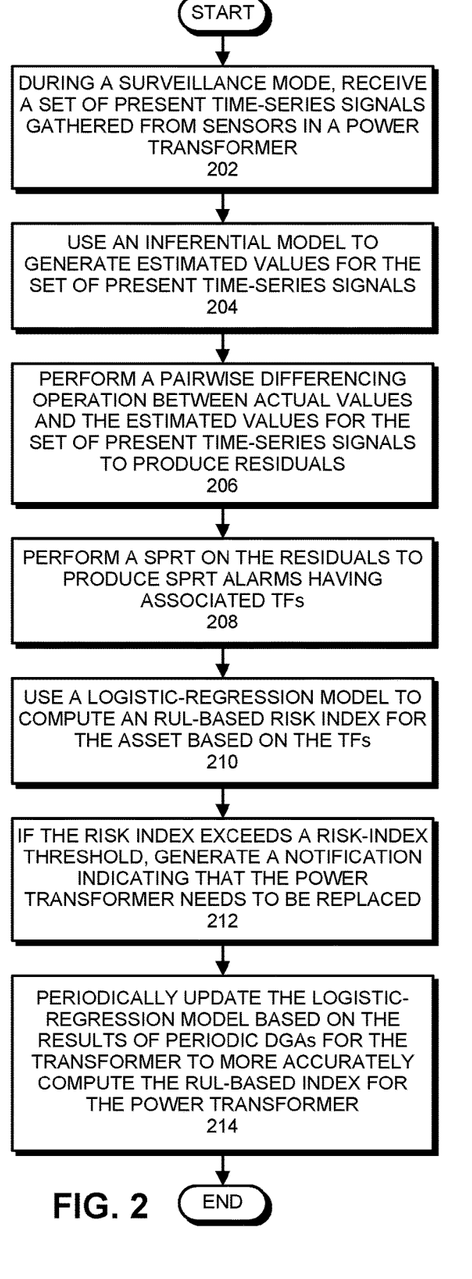
FIG. 2 presents a flow chart illustrating a process that performs a SPRT with an associated RUL estimation for a transformer in accordance with the disclosed embodiments.

FIG. 2 presents a flow chart illustrating a process that performs a SPRT with an associated RUL estimation for a transformer in accordance with the disclosed embodiments. During a surveillance mode, the system iteratively performs the following operations. First, the system receives a set of present time-series signals gathered from sensors in the power transformer (step 202). Next, the system uses an inferential model to generate estimated values for the set of present time-series signals (step 204), and performs a pairwise differencing operation between actual values and the estimated values for the set of present time-series signals to produce residuals (step 206). The system then performs a SPRT on the residuals to produce SPRT alarms having associated TFs (step 208). Next, the system uses a logistic-regression model to compute an RUL-based risk index for the power transformer based on the TFs (step 210). Finally, if the risk index exceeds a risk-index threshold, the system generates a notification indicating that the power transformer needs to be replaced (step 212). The system additionally periodically updates the logistic-regression model based on the results of periodic DGAs for the transformer to more accurately compute the RUL-based index for the power transformer (step 214).

Figure 3:
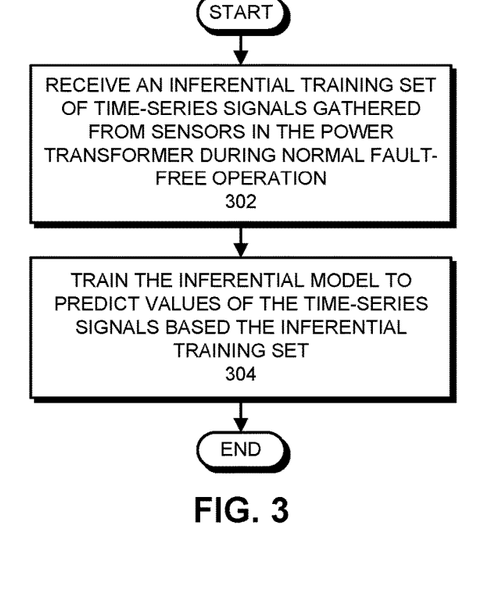
FIG. 3 presents a flow chart illustrating a process for training an inferential model in accordance with the disclosed embodiments.

FIG. 3 presents a flow chart illustrating a process for training an inferential model in accordance with the disclosed embodiments. During an inferential-training mode, which precedes the surveillance mode, the system receives an inferential training set of time-series signals gathered from sensors in the power transformer during normal fault-free operation (step 302). The system then trains the inferential model to predict values of the time-series signals based on the inferential training set (step 304).

Figure 4:
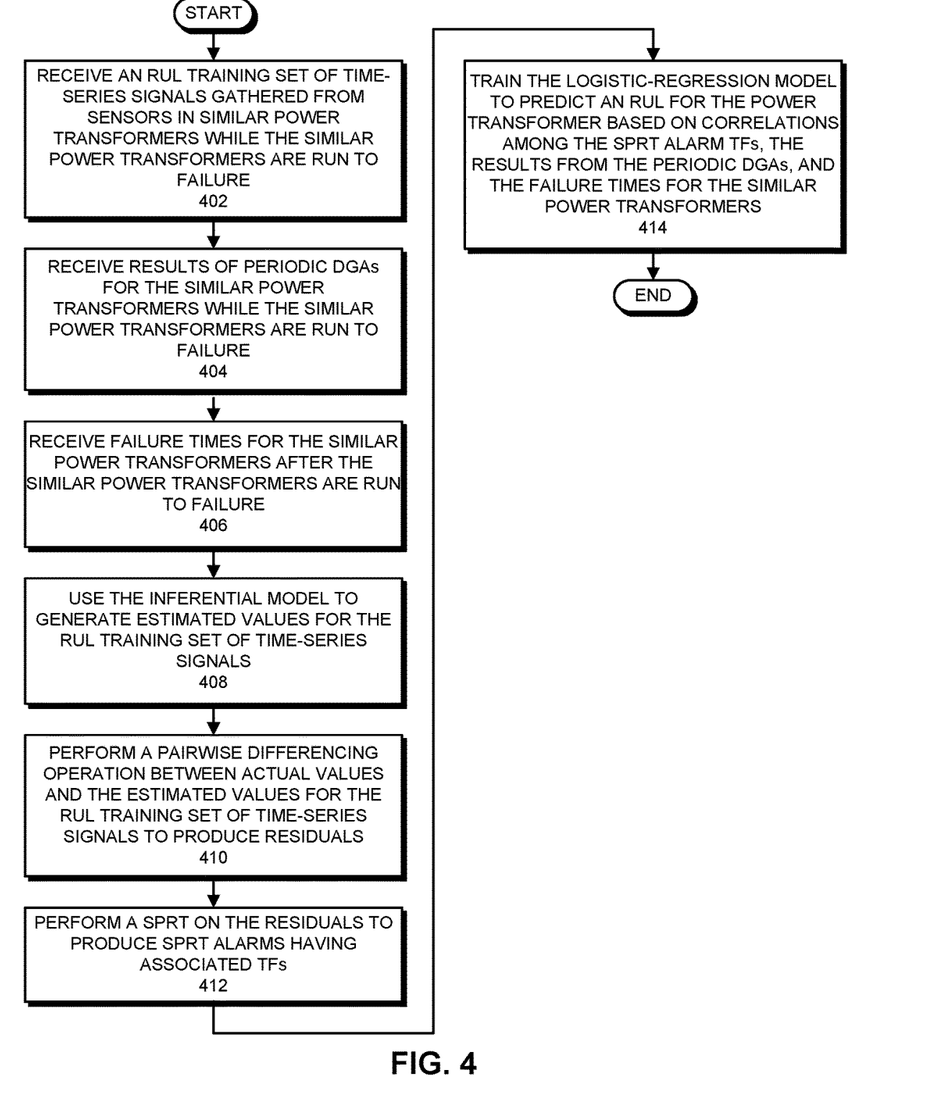
FIG. 4 presents a flow chart illustrating a process for training a logistic-regression model to predict an RUL for a power transformer in accordance with the disclosed embodiments.

FIG. 4 presents a flow chart illustrating a process for training a logistic-regression model to predict an RUL for an asset in accordance with the disclosed embodiments. During an RUL-training mode, which follows the inferential training mode and precedes the surveillance mode, the system receives an RUL training set of time-series signals gathered from sensors in similar power transformers while the similar power transformers were run to failure (step 402). The system also receives results of periodic DGAs for the similar power transformers while the similar power transformers were run to failure (step 404), and also failure times for the similar power transformers after the similar power transformers were run to failure (step 406). Next, the system uses the inferential model to generate estimated values for the RUL training set of time-series signals (step 408), and performs a pairwise differencing operation between actual values and the estimated values for the RUL training set of time-series signals to produce residuals (step 410). The system then performs a SPRT on the residuals to produce SPRT alarms having associated TFs (step 412). Finally, the system trains the logistic-regression model to predict an RUL for the power transformer based on correlations among the SPRT alarm TFs, the results from the periodic DGAs for the similar power transformers, and the failure times for the similar power transformers (step 414).

Figure 5:
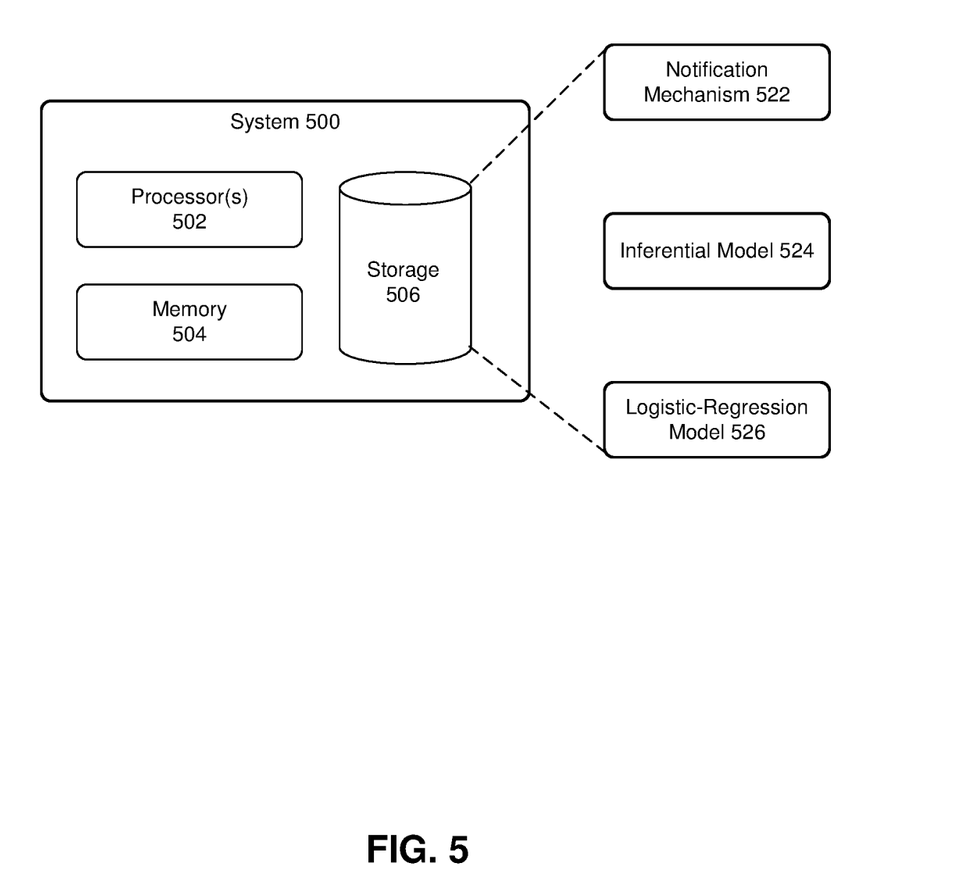
FIG. 5 illustrates a system for estimating a remaining useful life (RUL) of a power transformer in accordance with the disclosed embodiments.

FIG. 5 is a block diagram of a system for estimating a remaining useful life (RUL) of a power transformer, according to some embodiments.

System 500 comprises at least one processor 502, at least one memory 504, and non-transitory computer-readable storage medium 506. Storage 506 of the network intermediary stores instructions that may be loaded into memory 504 for execution by processor(s) 502. The instructions include notification mechanism 522, inferential model 524, and logistic-regression model 526.

As described above, notification mechanism 522 comprises processor-executable instructions for receiving a present set of time-series signals; using inferential model 524 to generate estimated values for the set of present time-series signals; performing a pairwise differencing operation between actual and estimated values for the set of present-time signals to produce residuals; performing a SPRT on the residuals; using logistic-regression model 526 to compute an RUL-based risk index of the power transformer; and, when the risk index exceeds a threshold, generating a notification.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for estimating a remaining useful life (RUL) of a power transformer, comprising:
during a surveillance mode, iteratively performing the following operations:
receiving a set of present time-series signals gathered from sensors in the power transformer,
using an inferential model to generate estimated values for the set of present time-series signals,
performing a pairwise differencing operation between actual values and the estimated values for the set of present time-series signals to produce residuals,
performing a sequential probability ratio test (SPRT) on the residuals to produce SPRT alarms having associated tripping frequencies (TFs),
using a logistic-regression model to compute an RUL-based risk index for the power transformer based on the TFs; and
when the risk index exceeds a risk-index threshold, generating a notification indicating that the power transformer needs to be replaced; and
periodically updating the logistic-regression model based on the results of periodic dissolved gas analyses (DGAs) for the transformer to more accurately compute the RUL-based index for the power transformer.

2. The method of claim 1, wherein during an inferential-training mode, which precedes the surveillance mode, the method further comprises:
receiving an inferential training set of time-series signals gathered from sensors in the power transformer during normal fault-free operation; and
training the inferential model to predict values of the time-series signals based on the inferential training set.

3. The method of claim 2, wherein during an RUL-training mode, which follows the inferential training mode and precedes the surveillance mode, the method further comprises:
receiving an RUL training set of time-series signals gathered from sensors in similar power transformers while the similar power transformers are run to failure;
receiving results of periodic DGAs for the similar power transformers while the similar power transformers were run to failure;
receiving failure times for the similar power transformers after the similar power transformers were run to failure;
using the inferential model to generate estimated values for the RUL training set of time-series signals;
performing a pairwise differencing operation between actual values and the estimated values for the RUL training set of time-series signals to produce residuals;
performing a SPRT on the residuals to produce SPRT alarms having associated TFs; and
training the logistic-regression model to predict an RUL for the power transformer based on correlations among the SPRT alarm TFs, the results from the periodic DGAs for the similar power transformers, and the failure times for the similar power transformers.

4. The method of claim 1, wherein updating the logistic-regression model based on the results of a periodic DGA involves using the results of the periodic DGA as an additional input to the logistic-regression model so that the logistic-regression model more accurately computes the RUL-based index for the power transformer.

5. The method of claim 1, wherein the time-series signals gathered from sensors in the power transformer include signals specifying one or more of the following:
temperatures;
currents;
voltages;
resistances;
capacitances;
vibrations;
cooling system parameters; and
control signals.

6. The method of claim 1, wherein the TFs are windowed TFs, which are associated with preceding time windows of SPRT alarms.

7. The method of claim 1, wherein the inferential model comprises a Multivariate State Estimation Technique (MSET) model.

8. A non-transitory, computer-readable storage medium storing instructions that when executed by a computer cause the computer to perform a method for estimating a remaining useful life (RUL) of a power transformer, the method comprising:
during a surveillance mode, iteratively performing the following operations:
receiving a set of present time-series signals gathered from sensors in the power transformer,
using an inferential model to generate estimated values for the set of present time-series signals, performing a pairwise differencing operation between actual values and the estimated values for the set of present time-series signals to produce residuals, performing a sequential probability ratio test (SPRT) on the residuals to produce SPRT alarms having associated tripping frequencies (TFs), using a logistic-regression model to compute an RUL-based risk index for the power transformer based on the TFs; and when the risk index exceeds a risk-index threshold, generating a notification indicating that the power transformer needs to be replaced; and periodically updating the logistic-regression model based on the results of periodic dissolved gas analyses (DGAs) for the transformer to more accurately compute the RUL-based index for the power transformer.

9. The non-transitory, computer-readable storage medium of claim 8, wherein during an inferential-training mode, which precedes the surveillance mode, the method further comprises:

receiving an inferential training set of time-series signals gathered from sensors in the power transformer during normal fault-free operation; and training the inferential model to predict values of the time-series signals based on the inferential training set.

10. The non-transitory, computer-readable storage medium of claim 9, wherein during an RUL-training mode, which follows the inferential training mode and precedes the surveillance mode, the method further comprises:

receiving an RUL training set of time-series signals gathered from sensors in similar power transformers while the similar power transformers are run to failure;

receiving results of periodic DGAs for the similar power transformers while the similar power transformers were run to failure;

receiving failure times for the similar power transformers after the similar power transformers were run to failure;

using the inferential model to generate estimated values for the RUL training set of time-series signals;

performing a pairwise differencing operation between actual values and the estimated values for the RUL training set of time-series signals to produce residuals;

performing a SPRT on the residuals to produce SPRT alarms having associated TFs; and training the logistic-regression model to predict an RUL for the power transformer based on correlations among the SPRT alarm TFs, the results from the periodic DGAs for the similar power transformers, and the failure times for the similar power transformers.

11. The non-transitory, computer-readable storage medium of claim 8, wherein updating the logistic-regression model based on the results of a periodic DGA involves using the results of the periodic DGA as an additional input to the logistic-regression model so that the logistic-regression model more accurately computes the RUL-based index for the power transformer.

12. The non-transitory, computer-readable storage medium of claim 8, wherein the time-series signals gathered from sensors in the power transformer include signals specifying one or more of the following:

temperatures;
currents;
voltages;
resistances;
capacitances;
vibrations;
cooling system parameters; and
control signals.

13. The non-transitory, computer-readable storage medium of claim 8, wherein the TFs are windowed TFs, which are associated with preceding time windows of SPRT alarms.

14. The non-transitory, computer-readable storage medium of claim 8, wherein the inferential model comprises a Multivariate State Estimation Technique (MSET) model.

15. A system that estimates a remaining useful life (RUL) of a power transformer, comprising:

at least one processor and at least one associated memory; and a notification mechanism that executes on the at least one processor, wherein during a surveillance mode, the notification mechanism:

receives a set of present time-series signals gathered from sensors in the power transformer, uses an inferential model to generate estimated values for the set of present time-series signals, performs a pairwise differencing operation between actual values and the estimated values for the set of present time-series signals to produce residuals, performs a sequential probability ratio test (SPRT) on the residuals to produce SPRT alarms having associated tripping frequencies (TFs), uses a logistic-regression model to compute an RUL-based risk index for the power transformer based on the TFs; and when the risk index exceeds a risk-index threshold, generates a notification indicating that the power transformer needs to be replaced;

wherein the notification mechanism periodically updates the logistic-regression model based on the results of periodic dissolved gas analyses (DGAs) for the transformer to more accurately compute the RUL-based index for the power transformer.

16. The system of claim 15, wherein during an inferential-training mode, which precedes the surveillance mode, the notification mechanism:

receives an inferential training set of time-series signals gathered from sensors in the power transformer during normal fault-free operation; and trains the inferential model to predict values of the time-series signals based on the inferential training set.

17. The system of claim 16, wherein during an RUL-training mode, which follows the inferential training mode and precedes the surveillance mode, the notification mechanism:

receives an RUL training set of time-series signals gathered from sensors in similar power transformers while the similar power transformers were run to failure;

receives results of periodic DGAs for the similar power transformers while the similar power transformers were run to failure;

receives failure times for the similar power transformers after the similar power transformers were run to failure;

uses the inferential model to generate estimated values for the RUL training set of time-series signals;

performs a pairwise differencing operation between actual values and the estimated values for the RUL training set of time-series signals to produce residuals;

performs a SPRT on the residuals to produce SPRT alarms having associated TFs; and trains the logistic-regression model to predict an RUL for the power transformer based on correlations among the SPRT alarm TFs, the results from the periodic DGAs for the similar power transformers, and the failure times for the similar power transformers.

18. The system of claim 15, wherein while updating the logistic-regression model based on the results of a periodic DGA, the notification mechanism uses the results of the periodic DGA as an additional input to the logistic-regression model so that the logistic-regression model more accurately computes the RUL-based index for the power transformer.

19. The system of claim 15, wherein the time-series signals gathered from sensors in the power transformer include signals specifying one or more of the following:
   temperatures;
   currents;
   voltages;
   resistances;
   capacitances;
   vibrations;
   cooling system parameters; and
   control signals.

20. The system of claim 15, wherein the TFs are windowed TFs, which are associated with preceding time windows of SPRT alarms.

* * * * *

UNITED STATES PATENT AND TRADEMARK OFFICE
CERTIFICATE OF CORRECTION

PATENT NO. : 11,099,219 B2
APPLICATION NO. : 16/295613
DATED : August 24, 2021
INVENTOR(S) : Gross et al.

It is certified that error appears in the above-identified patent and that said Letters Patent is hereby corrected as shown below:

In the Specification

In Column 6, Lines 4-5, delete "periodically," and insert -- periodically --, therefor.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*